(12) United States Patent
Geyl et al.

(10) Patent No.: US 8,023,182 B2
(45) Date of Patent: Sep. 20, 2011

(54) DEVICE FOR COLLECTING FLUX OF ELECTROMAGNETIC RADIATION IN THE EXTREME ULTRAVIOLET

(75) Inventors: Roland Geyl, Paris (FR); Vincent Patoz, Paris (FR); François Riguet, Paris (FR); François Dufresne De Virel, Paris (FR)

(73) Assignee: Sagem Defense Securite (FR)

( * ) Notice: Subject to any disclaimer, the term of this patent is extended or adjusted under 35 U.S.C. 154(b) by 493 days.

(21) Appl. No.: 12/226,038

(22) PCT Filed: Apr. 4, 2007

(86) PCT No.: PCT/FR2007/000573
§ 371 (c)(1),
(2), (4) Date: Oct. 6, 2008

(87) PCT Pub. No.: WO2007/118993
PCT Pub. Date: Oct. 25, 2007

(65) Prior Publication Data
US 2009/0244696 A1   Oct. 1, 2009

(30) Foreign Application Priority Data
Apr. 7, 2006   (FR) ..................................... 06 03116

(51) Int. Cl.
*G02B 5/08* (2006.01)
(52) U.S. Cl. ........... 359/359; 359/351; 359/859; 355/67

(58) Field of Classification Search ........................ None
See application file for complete search history.

(56) References Cited

U.S. PATENT DOCUMENTS

| 3,325,238 | A | * | 6/1967 | Geier ............................ 359/366 |
| 5,212,588 | A | * | 5/1993 | Viswanathan et al. ......... 359/355 |
| 5,737,137 | A |   | 4/1998 | Cohen et al. |
| 6,833,223 | B2 | * | 12/2004 | Shiraishi ............................ 430/5 |
| 6,894,834 | B2 | * | 5/2005 | Mann et al. .................... 359/366 |
| 7,405,871 | B2 | * | 7/2008 | Sasian ............................ 359/351 |
| 2004/0223531 | A1 |   | 11/2004 | Arenberg |
| 2005/0094764 | A1 |   | 5/2005 | Weiss |

FOREIGN PATENT DOCUMENTS

| EP | 1469349 | 9/2005 |
| JP | 2004-311814 | 11/2004 |
| JP | 2005-109502 | 4/2005 |
| WO | WO2005/031748 | 4/2005 |

* cited by examiner

*Primary Examiner* — Arnel C Lavarias
(74) *Attorney, Agent, or Firm* — Dean W. Russell; Kristin M. Crall; Kilpatrick Townsend & Stockton LLP (57) ABSTRACT

Device for collecting a flux of electromagnetic radiation in the extreme ultraviolet (EUV) emitted by a source, including a main, first collector stage, with a concave collector mirror placed in front of the source at a distance of greater than 250 mm and pierced by a central hole, and a convex mirror placed behind the concave mirror level with the source and pierced by a central hole, and at least a second collector stage with a concave collector mirror placed in front of the stage and pierced by a central hole and a convex mirror placed behind the concave mirror.

10 Claims, 4 Drawing Sheets

DEVICE FOR COLLECTING FLUX OF ELECTROMAGNETIC RADIATION IN THE EXTREME ULTRAVIOLET

CROSS REFERENCE TO RELATED APPLICATIONS

This application is the U.S. national phase of International Application No. PCT/FR2007/000573 filed on Apr. 4, 2007 and published in French on Oct. 25, 2007 as International Publication No. WO2007/118993 A1, which application claims priority to French Patent Application No. 0603116 filed on Apr. 7, 2006, the contents of both of which are incorporated herein by reference.

FIELD OF THE INVENTION

The present invention relates in a general way to the field of illumination with electromagnetic radiation situated in the extreme ultraviolet EUV and, more precisely, the invention relates to refinements made to devices for collecting electromagnetic radiation flux in the extreme ultraviolet (EUV) emitted by a source of EUV electromagnetic radiation, said devices comprising at least one collector stage.

BACKGROUND OF THE INVENTION

The expression "extreme ultraviolet" is understood to denote electromagnetic radiations having a wavelength of less than about 150 nm, and more specifically the wavelength of 13.5 nm which will be of more particular interest subsequently.

In what follows, reference will be made to the optical axis defined by the optical source and the image point which is formed thereof by the collector device, and the terms "front" and "rear" will be employed with reference to the direction from the source to the image point on this axis.

Collecting the luminous flux delivered by a quasi-pointlike source of electromagnetic radiation such as an arc lamp is not an easy thing to do when one wishes to collect the largest possible quantity of photons emitted by the source in the surrounding space.

This concern becomes all the more acute when the equipment into which the source and the luminous flux collector device are integrated must be optimized in relation to the useful luminous flux parameter for the method implemented.

Optical microlithography is typically a field for which expensive equipment must produce the largest quantity of silicon microchips per hour by irradiating a photosensitive resin deposited on silicon wafers from which the microchips will thereafter be sliced.

A few years ago, optical microlithography used sources of the mercury arc lamp type, selecting one of the spectral lines of said mercury arc, typically at wavelengths of 435 or 365 nm.

Currently, to etch ever finer patterns, microlithography machines use shorter wavelengths, typically 248 nm and 193 nm, delivered by power lasers of the KrF or ArF type. Collection of the luminous flux is facilitated thereby.

But the requirement for etching yet finer patterns on microchips leads to the envisaging of even shorter wavelengths provided by new types of sources.

EUV radiation at the wavelength of 13.5 nm is currently envisaged for the next generation of optical microlithography apparatus, forming the subject of significant developments in all the technologies involved in the various steps of the optical microlithography process:

making a mask receiving an object pattern intended to be projected by reduction onto the silicon wafer, making high-resolution optical projection devices designed to carry out said projection, making optical illumination devices designed to shape the flux collected so as to inject it onto the mask and the projection optic, making optical collector devices that pick up the maximum luminous flux provided by the source, making powerful, stable and reliable EUV sources, making machines (scanners) for manipulating and positioning the silicon wafers and the masks facing the optical devices and ensuring the best positioning precision and the best execution speed.

Significant research has been carried out on electromagnetic radiation sources situated in the extreme ultraviolet region. These sources belong to two principal categories, namely sources of the laser pulsed plasma type and sources of the capillary discharge plasma type.

The main characteristic of these two types of sources is to have a quasi-pointlike light emitter element, that is to say of a size which is typically of the order of a millimeter, but capable of radiating into a significant angular space of possibly as much as a hemisphere, or indeed more.

Another characteristic of EUV sources in view of the powers necessary for microlithographic applications is that they deliver many useful photons, but also other undesirable elements:

photons situated outside the useful spectral band, ions and other particles ejected at high speed which may erode the surface of the optical elements placed too near the source, diverse debris that is also deposited on the surface of the optical elements of the luminous flux collector device, an intense thermal radiation, partially absorbed by the optical elements of the luminous flux collector device which then undergo undesirable heating.

Thus, the resistance of the luminous flux collector device to these numerous attacks is a major critical element which must be solved in order to permit the effective deployment of EUV technology in the field of microlithography. One of the objects of the present invention is to provide an innovative response to this problem area.

EUV electromagnetic radiation, which is of short wavelength, is easily absorbed by the surfaces on which it is made to reflect.

To improve this reflectivity, it is known to reflect the radiation with the aid of a limited grazing reflection of 10 to 15° maximum (with respect to the reflecting surface or to its tangent plane) to obtain a reflectivity of 80% and more on metals such as ruthenium or molybdenum deposited on the polished surface of the reflector mirror, to reflect the radiation at quasi-normal incidence on the polished surface of a reflector mirror on which a set of thin layers has been deposited and which, through the physical phenomenon of constructive interference, afford a reflectivity of the order of 65 to 70%; however, one drawback is that, when the incidence of the radiation strays too far from normal incidence, the reflectivity decreases even if the thicknesses of the various layers are optimized to take account of the exact incidence of the rays.

The quantity of luminous flux which is collected and actually transmitted to the following optical modules of the microlithography machine is another critical element. Any percentage gain in the luminous flux collected with respect to the luminous flux emitted by the source allows a production rate gain and/or reduction in the requirement in terms of effective power of the source, therefore a reduction in its power of attack on the optical elements of the collector and thus a gain in terms of useful lifetime of the equipment as well as in the effective cost of the installation.

A simple and effective flux collector that is commonly used, in particular in cinema projectors, consists of an axisymmetric ellipsoidal collector mirror in which the source is placed at one of the foci, the image point being formed at the other focus. This device has the advantage of being simple and limited to a single component. However, it cannot be transposed to the EUV domain for several reasons. A first reason is that the flux collected is formed with the radiation emitted by the source toward the rear, then reflected toward the front, that is to say it "crosses" the source and is focused in front of the latter; now, EUV sources are complex and bulky devices (typically 30 to 40 cm in diameter for a luminous source point of about 1 mm): a source such as this placed at the focus of the ellipsoidal collector would block the flux reflected by the mirror. A second reason is to do with the fact that the angles of incidence of the rays on the useful surface of the collector vary greatly according to the location of the reflection on the surface of the mirror, from quasi-normal incidence at the center of the ellipsoidal mirror to almost grazing angles of incidence near the edge of the mirror; treatment of the reflecting surface so as to ensure reflection in the EUV region must therefore entirely change in nature between the center and the edge of the mirror, which is very complex, or indeed impossible, to achieve at least under acceptable economic conditions. Therefore, despite its advantage in principle, this solution cannot be employed.

The mode of EUV flux collection commonly adopted currently, inspired by the design of X-ray telescopes, consists in utilizing mirrors with grazing incidence and in using reflectors of quasi-cylindrical shape arranged one after the other and combined by inserting them into one another, so that the luminous flux collected is deflected by successive reflections at grazing angles of incidence and consists of successive angular rings with blocked-out intermediate zones in which the flux is lost. Another drawback of this known technique is that, to pick up a significant portion of the light emitted by the source, the first elements must be brought near to the source: in devices made on the basis of this principle, the first optical elements are placed at a distance of 10 to 15 cm from the source and attacks by erosion, contamination or heating then become very serious; the effective lifetime of the collector device remains limited (see for example document US 2005/094764).

Document EP 1 469 349 discloses a collector device for EUV flux based on the use of a concave mirror and of a convex mirror according to a "twin mirror telescope of the Cassegrain type" arrangement. This arrangement suffers from insufficient luminous collection effectiveness and does not constitute an appropriate response to the problem posed, in particular on account of the high angles of incidence of the rays arriving at the second convex mirror.

Document WO 2005/031748 presents a collector arrangement based on a large concave mirror which forms an image of the source shifted laterally with respect to the source; thereafter the luminous flux is reflected forward. This known device suffers from a lack of luminous collection effectiveness due to a limitation of the optical extent collected by the large mirror and due also to too close a proximity of the secondary mirror to the source itself, which hampers the course of the rays, as well as to the presence of various devices intended for capturing or deflecting the particles or debris emitted by the source.

Document US 2004/223531 presents an EUV flux collector device consisting of an elliptical mirror giving an image of the source point and supplemented with a second, annular mirror picking up the additional flux and returning it to the same image point by virtue of a second reflection on an "axicon" type element placed behind the source. The major drawback of this known solution is that it is inappropriate for sources of the "Capillary Discharge Plasma" type, since the optical path passes through the source, precisely where the optical, mechanical and electronic components operating the source are housed. This known device therefore has limited conditions of use which may be inappropriate within the context of a microlithography installation.

Document JP 2005/109502 presents a device comprising a collector which conjugates the source point and the image point of the source and which is mounted on a moving support. This known device does not provide an effective response and does not obviate the resulting drawback of the high degree of deformation of the optics under the thermal flux of the source.

In a general manner, none of the currently known devices is capable of collecting an appreciable fraction of the luminous flux emitted by the source, and their effectiveness remains limited to a few percent and/or they are arranged in a manner such that some at least of their components are rapidly impaired and/or they are too cumbersome for the application more specifically envisaged in the field of microlithography.

The constraints inherent in integrating the collector device into a microlithography machine operating with an EUV source should also be remembered: impossibility of implementing optical lenses, no material being transparent for these wavelengths, and necessity of implementing reflecting optical components only; bulky source which requires that the entire optical collection hardware be situated in front of this source; very congested environment which leaves only a restricted free space for setting up the optical collection components; focusing distance (typically of the order of 1.20 m) which is not capable of being appreciably lengthened because of the constraints of general congestion within the machine.

Finally, it is apparent that, in the device indicated in the preamble, the central part of the light cone emitted by the source is not picked up by the main stage of the collector device which has just been described. Although not critical since this central part represents only a small proportion of the total flux emitted by the source, it is however beneficial to seek to collect the maximum of flux emitted by the source, so as to improve the performance of the device to the maximum.

SUMMARY OF THE INVENTION

It is within this context that the object of the invention is essentially to respond to practical expectations and to propose an EUV flux collector device which is remarkably effective while complying with the numerous aforesaid constraints.

To these ends, the invention proposes a device for collecting electromagnetic radiation flux in the extreme ultraviolet (EUV) emitted by an EUV electromagnetic radiation source, said device comprising at least one collector stage, which EUV flux collection device, being arranged in accordance with the invention, is characterized in that it comprises at least one exterior additional collector stage situated in front of the previous collector stage and comprising:

a concave collector mirror, provided with a central through-hole and placed coaxially with the optical axis in front of the concave mirror of the previous collector stage, its concavity being directed toward the source, a convex mirror placed centrally, coaxially with the optical axis, approximately level with the concave mirror of the previous collector stage, its convexity being directed toward the front, the concave collector mirror being suitable for receiving the part of the flux emitted by the source which reaches it by passing between the opposite edges respectively of the concave collector mirror of the previous stage and of the convex mirror and for reflecting this flux toward a point situated at the rear of said convex mirror, the convex mirror being suitable for reflecting, through the central through-hole of the concave collector mirror of said exterior additional collector stage, the flux received from said concave collector mirror of the exterior additional collector stage toward said final image point in front of the source, the concave collector mirror and the convex mirror of the exterior additional collector stage being coated with a multilayer reflective deposition suitable for maximizing the transmission of EUV radiation, said reflective deposition comprising several layers adjusted according to the angle of incidence of the EUV radiation.

Such an additional collector stage is able to transmit a few percent (typically of the order of 5%) of the light emitted by the source, so that the collector device equipped with the aforesaid two stages can provide the image point with about 30% of the light from the source, thereby representing an appreciable improvement in the performance of the device, while the resulting dimensional increase is acceptable, it being possible for the collector device to be housed in the available space in the microlithography machine.

The features which have just been set forth in accordance with the present invention make it possible to construct a device for collecting EUV optical flux, and in particular at a wavelength of 13.5 nm. This refined device has the essential advantage of returning the light on the same side as the collector itself without "crossing" the source, which arrangement is fundamental in view of the very significant dimensions of the EUV sources implemented. Moreover, this is a highly effective device which collects a large quantity of the light emitted by the source; typically, such a device is capable of transmitting of the order of 20 to 25% of the quantity of light emitted by the source, as compared to the quantity of the order of 6% transmitted in current microlithography machines. Additionally, the radius of curvature of the concave collector mirror is big enough for the reflecting surface to remain a large distance, greater than about 250 mm, from the source, and typically a distance of between 400 and 500 mm from the source; therefore, the reflecting surface of the concave collector mirror remains out of range of the diverse particles emitted by the source; in this way, the surface energy density of the radiation on the concave collector mirror is reduced and the durability of its reflective coating is ensured. Finally, it will be noted that the collector device in accordance with the invention delivers an annular conical light beam which is devoid of discontinuities, unlike the beam delivered by devices having mirrors with grazing incidence.

In a manner known per se to the person skilled in the art, it is possible for the layers of the reflective deposition to have thicknesses that increase with the angle of incidence; stated otherwise, the layers of the reflective deposition have thicknesses that increase from the central edge to the peripheral edge of the mirrors. These reflective depositions can consist in a manner known per se of alternating layers of molybdenum and silicon a few nanometers thick.

If need be, it is possible to provide at least one other exterior additional collector stage which is situated in front of the other previous additional collector stage in which the convex mirror is provided with a central through-hole and which comprises:

a concave collector mirror, provided with a central through-hole, placed coaxially with the optical axis in front of the concave collector mirror of the previous collector stage, its concavity being directed toward the source, a convex mirror placed centrally, coaxially with the optical axis, approximately level with the concave mirror of the previous collector stage, its convexity being directed toward the front, the concave collector mirror being suitable for receiving the part of the flux emitted by the source which reaches it by passing between the opposite edges respectively of the hole of the convex mirror of the previous stage and of the convex mirror of the other stage and for reflecting this flux toward a point situated at the rear of said convex mirror, the convex mirror being suitable for reflecting, through the central through-hole of the concave collector mirror of said other additional collector stage, the flux received from said concave collector mirror of the other exterior additional collector stage toward said final image point in front of the source, the concave collector mirror and the convex mirror of the other exterior additional collector stage being coated with a multilayer reflective deposition suitable for maximizing the transmission of EUV radiation, said reflective deposition comprising several layers adjusted according to the angle of incidence of the EUV radiation.

However, the increase in the quantity of light afforded by this other exterior additional stage remains limited to a few percent, typically of the order of 2 to 3%.

However, to avoid an excessive axial lengthening of the collector device, it is conceivable to provide an interior additional collector stage which is situated at the rear of an exterior additional collector stage in which the convex mirror is provided with a central through-hole and which comprises:

a concave collector mirror, placed coaxially with the optical axis at the rear of the convex mirror of the exterior additional collector stage and provided with a central through-hole, which is suitable for receiving the flux emitted by said source and for reflecting this flux toward a point situated at the rear of the source, said concave mirror of the interior additional collector stage being coated with a multilayer reflective deposition suitable for maximizing the transmission of EUV radiation, said reflective deposition comprising several layers adjusted according to the angle of incidence of the EUV radiation, and a convex mirror placed centrally, coaxially with the optical axis, at the rear of the concave mirror of the interior additional collector stage and suitable for reflecting, through the central through-hole of the concave mirror of the interior additional collector stage, the flux received from the mirror of the interior additional collector stage toward said final image point in front of the source, said convex mirror of the interior additional collector stage being coated with a multilayer reflective deposition suitable for maximizing the transmission of EUV radiation, said reflective deposition comprising several layers adjusted according to the angle of incidence of the EUV radiation.

In a simple embodiment, provision is then made for the concave mirror of the interior additional collector stage to be situated at the back of the convex mirror of said exterior additional collector stage.

Admittedly, the convex mirror implemented in the interior additional collector stage which has just been described is relatively close to the source and will therefore be subjected to the bombardments of the particles emitted by it. However, it is the rear face of the convex mirror which is exposed, this having no impact on maintaining the optical quality of its reflecting surface.

Various concrete exemplary embodiments can be envisaged on the basis of the additional stages which have just been set forth.

It may be noted that, in the device in accordance with the main provisions of the invention, the central part of the light cone emitted by the source is not picked up. It is therefore possible to envisage, if it is desired to further improve the quantity of light collected, to add an additional collector stage, so that the collector device is then equipped with three collector stages, namely a main collector stage and two additional collector stages. This provision may make it possible to increase the quantity of light collected by a few percent, which may for example reach a value of about 32 to 34%. The additional collector stage latterly added can be an exterior additional stage arranged in front of the aforesaid additional stage; however, the collector device becomes cumbersome along the optical axis and it may no longer be possible for it to be housed in the available free space. It is then possible to resort to an interior additional collector stage which is placed at the rear of the additional collector stage, between the latter and the source, and which in no way increases the overall bulk of the collector device; a drawback may however result from the increase in weight and cost of the collector device thus constructed as compared to a relatively modest gain in the quantity of light collected.

It will be pointed out that the mirrors of the various stages can be defined geometrically and positioned in such a way as not to block out the light transmitted by the stages situated at the rear, with the various light beams skimming the edges of the mirrors. It follows from this that the conical light beams delivered by the various stages can be perfectly juxtaposed, without discontinuity, and form a continuous conical light beam.

It is furthermore possible to resort to numerous structural expedients in the design of the mirrors, which make it possible to increase the optical quality of the collector device and/or to facilitate the manufacture and reduce the cost of the device. In particular, provision may be made for one at least of the two mirrors of at least one collector stage to be made with an axisymmetric aspherical profile and/or for one at least of the two mirrors of at least the main collector stage (the larger of whose two mirrors may typically have a diameter of the order of 1.10 m) to be made in segmented form.

BRIEF DESCRIPTION OF THE DRAWINGS

The invention will be better understood on reading the description which follows of some preferred embodiments given solely by way of nonlimiting examples. In this description, reference is made to the appended drawings in which.

DETAILED DESCRIPTION OF THE INVENTION

Figure 1:
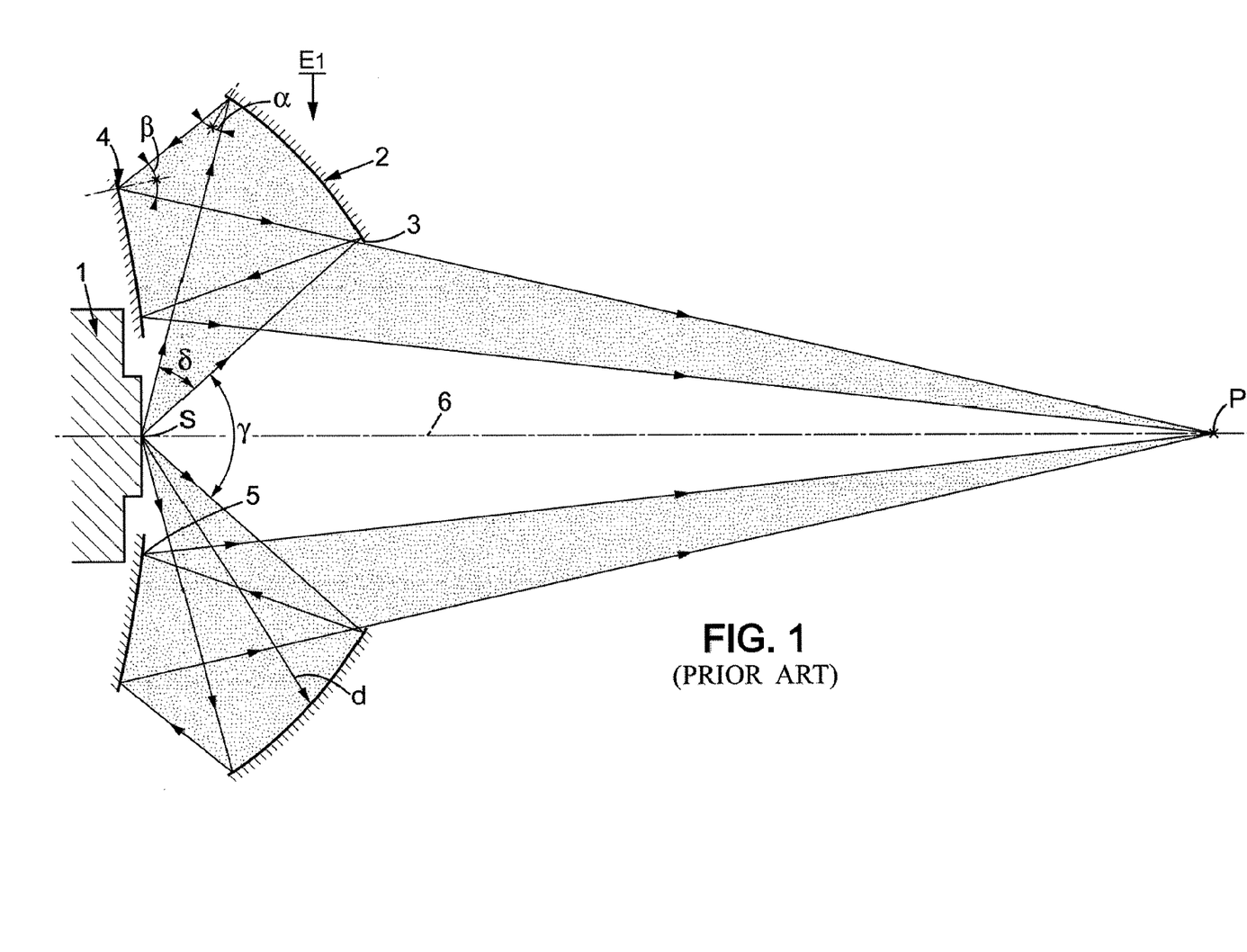
FIG. 1 is an optical diagram of a one-stage collector device of the prior art.

Reference is first made to FIG. 1 which illustrates a device for collecting electromagnetic radiation having a wavelength situated in the EUV extreme ultraviolet—that is to say, less than about 150 nm, and typically 13.5 nm within the framework of application to a microlithography machine—which is emitted by a source S. Although in the optical diagram the source S is depicted in pointlike form, such a source is, in practice, a very bulky device as shown diagrammatically as 1.

The collector device represented in FIG. 1 comprises a single collector stage, which will be termed the main collector stage, designated by E1, which is constructed as follows.

A concave collector mirror 2, provided with a central through-hole 3, is placed in front of the source S, its concavity being directed toward the source S. The concave mirror 2 is suitable for receiving a part of the flux emitted by said source S and for reflecting this flux toward a point situated at the rear of the source S. The concave mirror 2 is coated with a multilayer reflective deposition suitable for maximizing the transmission of EUV radiation, said reflective deposition comprising several layers adjusted according to the angle of incidence of the EUV radiation.

A convex mirror 4 is placed at the rear of the concave mirror 2, approximately level with the source S, its convexity being directed toward the front. The convex mirror 4 is provided with a central through-hole 5 suitable for allowing through the flux emitted by the source S toward the concave mirror 2. The convex mirror 4 is suitable for reflecting, through the central through-hole 3 of the concave mirror 2, the flux received from the concave mirror 2 toward a final image point P situated in front of the source S and in front of the concave mirror 2. The convex mirror 4 is coated with a multilayer reflective deposition suitable for maximizing the transmission of EUV radiation, said reflective deposition comprising several layers adjusted according to the angle of incidence of the EUV radiation.

The source S and said final image point P define an optical axis 6 with which said concave 2 and convex 4 mirrors are coaxially arranged.

The angles of incidence $\alpha$ and $\beta$ of the EUV radiation respectively on the concave 2 and convex 4 mirrors are less than about 25° relative to the normal, as can be seen in FIG. 1.

The concave mirror 2 is placed a distance d from the source S which is greater than about 250 mm, and which is typically between 400 and 500 mm, so that the concave mirror 2 is situated out of reach of the particles emitted by the source S.

The multilayer reflective deposition mentioned above, which is suitable for reflecting EUV radiation, can be of a type known to the person skilled in the art, consisting of alternations of layers in particular of molybdenum and of layers of silicon a few nanometers thick. Through the physical phenomenon of constructive interference, these layers afford high reflectivity, of the order of 65 to 70% for radiation close to normal incidence. The thickness of these layers is adjusted to take account of the exact incidence of the rays, that is to say this thickness (which would be a minimum precisely where the incidence would be normal, this not being the case in FIG.

1) increases as the incidence deviates further from normal; in particular, for the concave mirror 2, the incidence is lower (although not zero) in proximity to the central through-hole 3 than toward the external periphery of the mirror, this resulting in layers whose thicknesses increase radially from the interior toward the exterior of the mirror 2. Additionally, although alternate molybdenum and silicon layers is the most common solution, it is possible to resort to any other appropriate material or appropriate combination of materials. Because of this arrangement and by limiting the angle of incidence of the rays to about 25° at most, an optimum degree of reflection of the light emitted by the source S is ensured.

As may be seen clearly in FIG. 1, the beam emanating from the convex mirror 4 is an annular conical beam depicted shaded (the optical paths of the radiations from the source S to the image point P through the first collector stage E1 are labeled by simple arrows).

In a typical exemplary embodiment relating to an illumination device in a microlithography machine, the Applicant has been able to measure that a quantity of light representing 20 to 25% of the light emitted by the source S reached the final image point P (about 1.20 m away from the source S), this being considerable by comparison to the quantity of light of the order of 6% gathered in known machines having a different configuration.

In the embodiment of the collector device of the invention that has a main collector stage E1 which has just been described with reference to FIG. 1, the fraction of the light emitted by the source S which is utilized by stage E1 forms an annular cone of approximately 40°, of aperture $\delta$, while the light emitted in a central cone of angle $\gamma$, of about 70° aperture, remains unutilized.

To alleviate this deficiency, there is provision in accordance with the invention to add to the main collector stage E1 one or more collector stages designed to gather at least a part of the light emitted by the source S in the central cone of angle $\gamma$.

Figure 2:
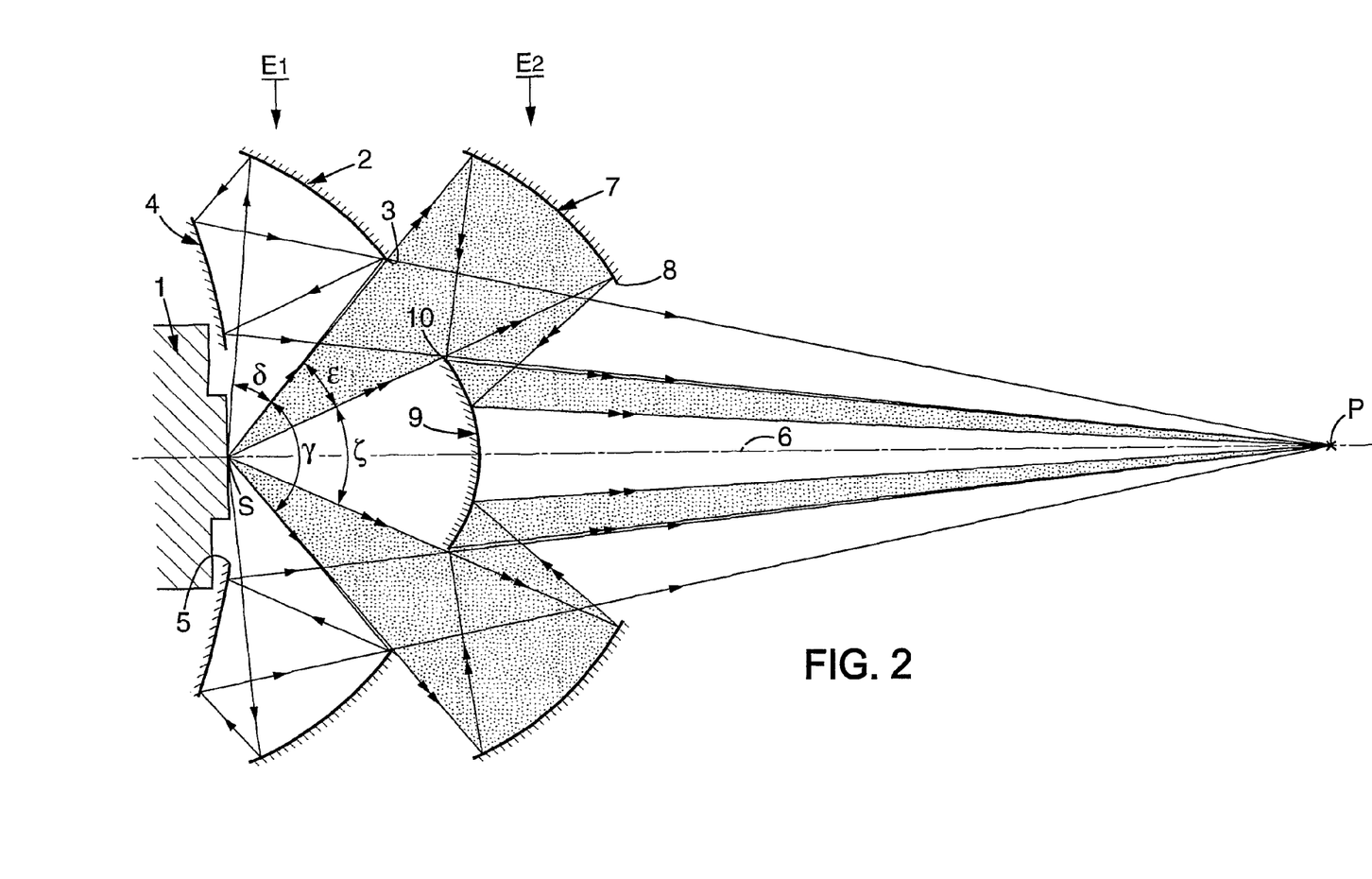
FIG. 2 is an optical diagram of a collector device arranged in accordance with the invention, showing the main stage of FIG. 1 to which is appended an exterior additional stage in accordance with the invention.

To this end, as illustrated in FIG. 2, it is proposed that the main collector stage E1 be supplemented with at least one exterior additional collector stage E2 situated in front of the main collector stage E1 and constructed as follows.

A concave collector mirror 7, provided with a central through-hole 8, is placed coaxially with the optical axis 6 in front of the concave mirror 2 of the previous collector stage E1, its concavity being directed toward the source S.

A convex mirror 9 is placed centrally, coaxially with the optical axis 6, approximately level with the concave mirror 2 of the previous collector stage E1, its convexity being directed toward the front.

The concave collector mirror 7 is suitable for receiving the part of the flux emitted by the source S which reaches it by passing between the opposite edges 3 of the concave collector mirror 2 of the previous stage E1 and 10 of the convex mirror 9 and for reflecting this flux toward a point situated at the rear of said convex mirror 9.

The convex mirror 9 is suitable for reflecting, through the central through-hole 8 of the concave collector mirror 7 of said additional collector stage E2, the flux received from said concave collector mirror 7 of the exterior additional collector stage E2 toward said final image point P in front of the source S.

Just as for the main collector stage E1, the concave collector mirror 7 and the convex mirror 9 of the additional collector stage E2 are coated with a multilayer reflective deposition suitable for maximizing the transmission of EUV radiation, said reflective deposition comprising several layers adjusted according to the angle of incidence of the EUV radiation.

As may be clearly seen in FIG. 2, the beam handled by the additional collector stage E2 depicted shaded (the optical paths of the radiations from the source S to the image point P through the second collector stage E2 are labeled by double arrows) sits tightly within the beam handled by the main collector stage E1, the two beams being adjacent without discontinuity and jointly providing, seen from the image point P, a single light beam.

In the arrangement in accordance with the invention as illustrated in FIG. 2, there is a single additional collector stage E2 and therefore the centrally situated convex mirror 9 can either be shaped like a dish as illustrated or else, since only its peripheral annular part is of use, be of annular shape like the mirrors 2 and 4 of the stage E1.

The implementation of the exterior additional collector stage E2 makes it possible to gather a fraction of the order of 5% of the light emitted by the source S, so that, assuming the main collector stage E1 gathers about 25% of the light emitted by the source, together the two stages collect about 30% of the light from the source S, this being considerable.

In the arrangement in accordance with the invention of the collector device of the invention with an additional collector stage E2 which has just been described with reference to FIG. 2, the fraction of the light emitted by the source S which is utilized by stage E2 forms an annular cone of aperture $\epsilon$, while the light emitted in a central cone of aperture $\zeta$ always remains unutilized.

This can be considered to be a deficiency which may be alleviated by supplementing the additional collector stage E2 with a further additional collector stage designed to gather at least a part of the light emitted by the source S in the central cone of aperture $\zeta$.

Figure 3:
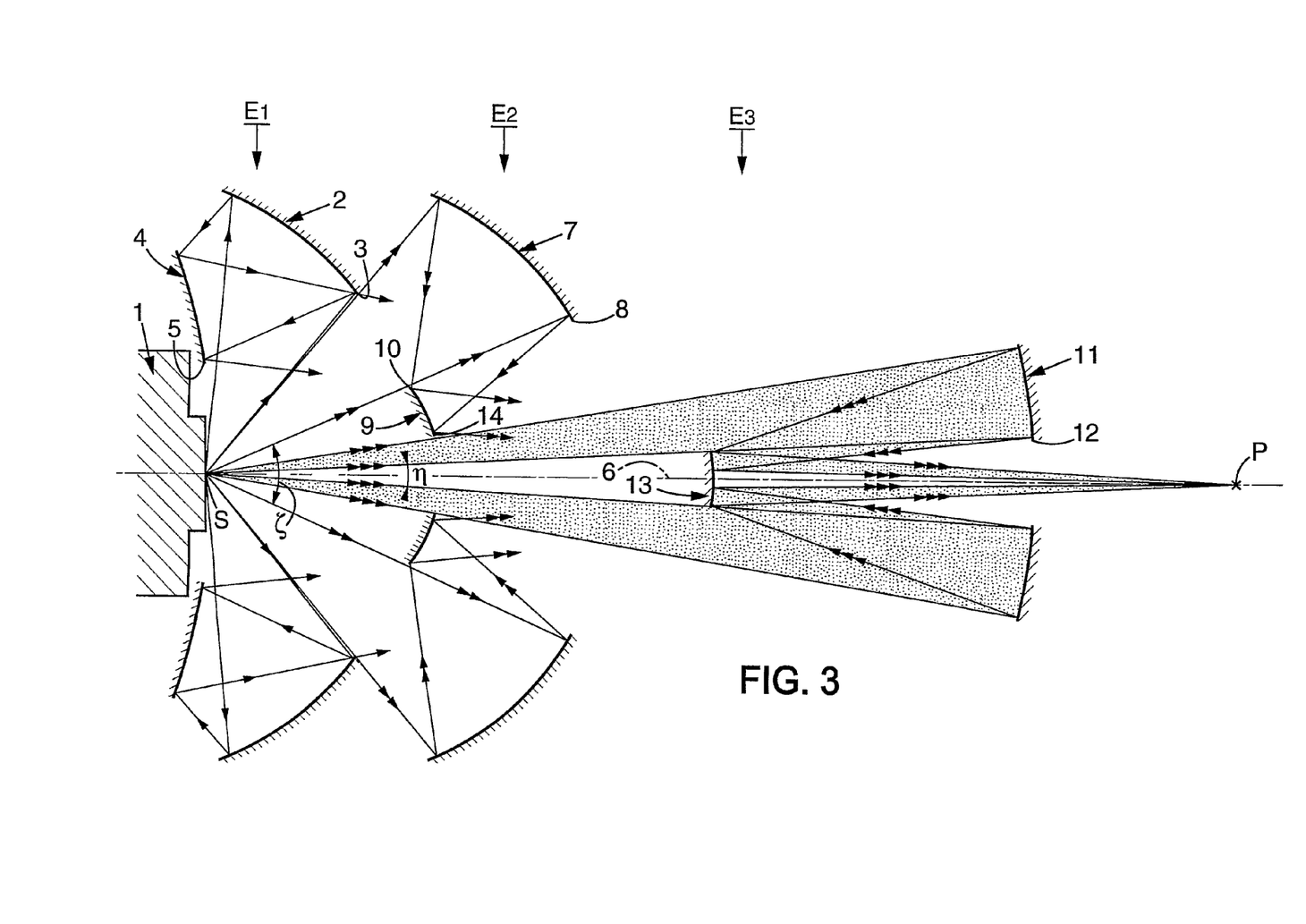
FIG. 3 is an optical diagram showing the arrangement of FIG. 2 (whose light beam is only partially represented for the sake of clarity) to which is appended another, exterior, additional stage in accordance with the invention.

To this end, as illustrated in FIG. 3, it is possible to supplement the additional collector stage E2 with another exterior additional collector stage E3 situated in front of the additional collector stage E2 and constructed in an analogous manner as follows.

A concave collector mirror 11, provided with a central through-hole 12, is placed coaxially with the optical axis 6 in front of the concave mirror 7 of the previous collector stage E2, its concavity being directed toward the source S.

A convex mirror 13 is placed centrally, coaxially with the optical axis 6, approximately level with the concave mirror 7 of the previous collector stage E2, its convexity being directed toward the front.

It will be noted that in this configuration with three collector stages in cascade the convex mirror 9 of collector stage E2 is provided with a central through-hole 14.

The concave collector mirror 11 is suitable for receiving the part of the flux emitted by the source S which reaches it by passing between the opposite edges respectively of the hole 14 of the convex mirror 9 of the previous stage E2 and of the convex mirror 13 of stage E3 and for reflecting this flux toward a point situated at the rear of said convex mirror 13.

The convex mirror 13 is suitable for reflecting, through the central through-hole 12 of the concave collector mirror 11 of said additional collector stage E3, the flux received from said concave collector mirror 11 of the exterior additional collector stage E3 toward said final image point P in front of the source S.

Just as for the collector stages E1 and E2, the concave collector mirror 11 and the convex mirror 13 of the exterior additional collector stage E3 are coated with a multilayer reflective deposition suitable for maximizing the transmission of EUV radiation, said reflective deposition comprising several layers adjusted according to the angle of incidence of the EUV radiation.

As may be clearly seen in FIG. 3, the beam handled by the exterior additional collector stage E3 depicted shaded (the optical paths of the radiations from the source S to the image point P through the third collector stage E3 are labeled by triple arrows, the optical paths of the stages E1 and E2 being plotted only partially so that the representation of FIG. 3 remains more readable) sits tightly within the beam handled by the additional collector stage E2, the three beams emanating from stages E1, E2 and E3 being adjacent without discontinuity and jointly providing, seen from the image point P, a single light beam.

The third collector stage E3 which has just been described is able to gather a fraction of the order of a few percent (typically of the order of 2 or 3%) of the light emitted by the source S, so that together the collector device with three stages E1, E2, E3 can bring of the order of 32 to 33% of the light from the source S to the image point P.

Of course, it remains possible to supplement the collector device with as high a number of additional collector stages as desired in an attempt to gather a maximum quantity of the light from source S; in particular, a fourth exterior additional stage could be added in front of the third collector stage E3 so as to handle at least a part of the light emitted by the source S in the cone of aperture η not handled by the stage E3.

However, it is necessary to take into consideration that each additional collector stage handles only a much smaller fraction of light than the collector stage which precedes it. Now, in view of the optical quality of the hardware implemented and therefore of its very high cost and having regard also to the high extra weight of each additional stage, it is unfeasible to multiply the number of collector stages ad infinitum.

In practice, a collector device with one or two stages as shown in FIG. 1 or 2 is very satisfactory in terms of the quantity of light that it is able to bring to the image point P and such a device can satisfy most applications on its own.

However, in cases where a gain of a few percent proves out to be necessary, a setup with three collector stages can be implemented under acceptable economic and weight conditions. The setup with three exterior collector stages as shown in FIG. 3 meets these requirements. However, it will be noted that, whereas the collector device of FIG. 1 with a single main collector stage is of small axial bulk and the collector device of FIG. 2 with two collector stages still remains compact (it sits within a cube overall), by contrast the addition of a third exterior collector stage as shown in FIG. 3 gives rise to a considerable axial lengthening of the collector device by reason in particular of the very great inclination of the beam to the optical axis 6. It may not be possible to install so long a device in machines where the free space is restricted, as is the case in particular in microlithography machines.

To avoid this difficulty, it is proposed that an interior additional stage be installed, that is to say an additional stage F3 situated at the rear of the second stage E2 in which the convex mirror 9 is provided with a central through-hole 14. The stage F3 is arranged as follows as illustrated in FIG. 4.

A concave collector mirror 15 with concavity directed toward the source S is placed coaxially with the optical axis 6 at the rear of the convex mirror 9 of the exterior additional collector stage E2. The concave collector mirror 15 is provided with a central through-hole 16 and is suitable for receiving a part of the flux emitted by the source S in the cone of aperture ζ and for reflecting this flux toward a point situated at the rear.

Figure 4:
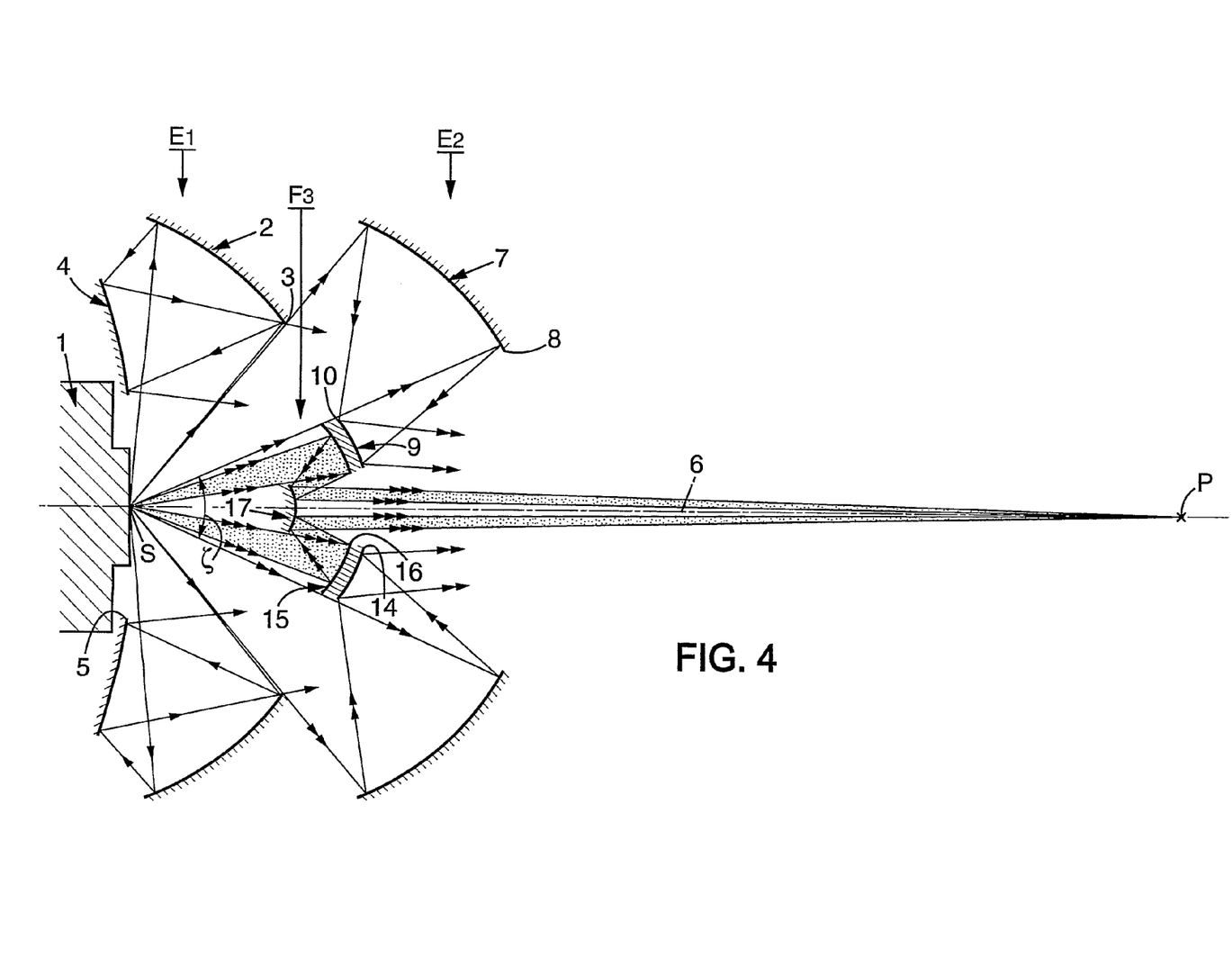
FIG. 4 is an optical diagram showing the arrangement of FIG. 2 (whose light beam is only partially represented for the sake of clarity) to which is appended another, interior, additional stage in accordance with the invention.

In a simply structured exemplary embodiment, it is possible to contrive matters such that, as shown in FIG. 4, the concave collector mirror 15 of the interior additional collector stage F3 is situated at the back of the convex mirror 9 of the exterior additional collector stage E2.

A convex mirror 17 with convexity directed toward the front is placed centrally, coaxially with the optical axis 6, at the rear of said concave collector mirror 15. The convex mirror 17 is suitable for reflecting, through the central through-hole 16 of the concave collector mirror 15, the flux received from the concave mirror 15 toward said final image point P.

The concave collector mirror 15 and the convex mirror 17 of the interior additional collector stage F3 are coated with a multilayer reflective deposition suitable for maximizing the transmission of EUV radiation, said reflective deposition comprising several layers adjusted according to the angle of incidence of the EUV radiation.

As may be clearly seen in FIG. 4, the beam handled by the interior additional collector stage F3 depicted shaded (the optical paths of the radiations from the source S to the image point P through the third collector stage F3 are labeled by triple arrows, the optical paths of the stages E1 and E2 being plotted only partially so that the representation of FIG. 4 remains more readable) sits tightly within the beam handled by the additional collector stage E2, the three beams emanating from stages E1, E2 and F3 being adjacent without discontinuity and jointly providing, seen from the image point P, a single light beam.

Admittedly, in the arrangement which has just been described, the convex mirror 17 of the interior additional stage F3 is relatively close to the source S. However, it is the rear face of this convex mirror 17 which is directed toward the source S and which is subjected to bombardment by the particles ejected by the source, thus not affecting the optical qualities of this mirror whose forward-directed reflecting face remains protected.

The arrangement which has just been described with reference to FIG. 4 retains the same general bulk as the two-stage collector device of FIG. 2 and makes it possible to gather a supplement of the order of a few percent (typically about 2 to 3%) of the quantity of light emitted by the source S.

The various arrangements which have been described above with reference to FIGS. 1 to 4 may give rise to numerous practical implementation variants. In particular, it will be noted that the concave collector mirror 2 of the main collector stage E1 may have a sizable diameter of greater than a meter, typically of the order of 1.10 m. Such a mirror is heavy and difficult to manufacture. To simplify its manufacture and optical fine-tuning, it is perfectly conceivable for this mirror to be made in segmented form. If need be, other larger-diameter mirrors can also be manufactured in this way. Additionally, provision may be made for one at least of the two mirrors of all or some of the collector stages to be made with an axisymmetric aspherical profile.

What is claimed is:

1. A device for collecting electromagnetic radiation flux in the extreme ultraviolet (EUV) emitted by an EUV electromagnetic radiation source, said device comprising at least one main collector stage comprising:

a first concave collector mirror with concavity directed toward the source, placed in front of the source and provided with a first central through-hole, which is suitable for receiving the flux emitted by said source and for reflecting this flux toward a point situated at the rear of the source, and a first convex mirror with convexity directed toward the front, placed at the rear of the first concave collector mirror and suitable for reflecting, through the first central through-hole of the first concave collector mirror, the flux received from the first concave collector mirror toward a final image point in front of the source and in front of the first concave collector mirror, said first convex mirror being placed approximately level with the source and being provided with a second central through-hole suitable for allowing through the flux emitted by the source toward the first concave collector mirror;

said first concave collector and first convex mirrors being coated respectively with first and second multilayer reflective depositions suitable for maximizing the transmission of EUV radiation, each of said first and second reflective depositions comprising several layers adjusted according to the angle of incidence of the EUV radiation;

said source and said final image point defining an optical axis with which said first concave collector and first convex mirrors are coaxially arranged;

the angles of incidence of the EUV radiation on the first concave collector and first convex mirrors being less than about 25° relative to the normal; and the first concave collector mirror being placed at a distance from the source which is greater than about 250 mm;

wherein said device comprises at least a first exterior additional collector stage situated in front of the main collector stage and comprising:

a second concave collector mirror, provided with a third central through-hole and placed coaxially with the optical axis in front of the first concave collector mirror of the main collector stage, the concavity of the second concave mirror being directed toward the source, a second convex mirror placed centrally, coaxially with the optical axis, approximately level with the first concave collector mirror of the main collector stage, the convexity of the second convex mirror being directed toward the front, the second concave collector mirror being suitable for receiving the part of the flux emitted by the source which reaches it the second concave collector mirror by passing between the opposite edges respectively of the first concave collector mirror of the main stage and of the second convex mirror and for reflecting this flux toward a point situated at the rear of said second convex mirror, the second convex mirror being suitable for reflecting, through the third central through-hole of the second concave collector mirror of said first exterior additional collector stage, the flux received from said second concave collector mirror of the first exterior additional collector stage toward said final image point in front of the source, the second concave collector mirror and the second convex mirror of the first exterior additional collector stage being coated respectively with third and fourth multilayer reflective depositions suitable for maximizing the transmission of EUV radiation, each of said third and fourth multilayer reflective depositions comprising several layers adjusted according to the angle of incidence of the EUV radiation.

2. The device for collecting EUV radiation flux as claimed in claim 1, wherein said first concave collector mirror of the main collector stage is placed at a distance from the source of between about 400 and 500 mm.

3. The device for collecting EUV radiation flux as claimed in claim 1, wherein said layers of the first, second, third and fourth reflective depositions have thicknesses that increase with the angle of incidence.

4. The device for collecting EUV radiation flux as claimed in claim 1, wherein said device comprises at least a second exterior additional collector stage which is situated in front of the first exterior additional collector stage in which the second convex mirror is provided with a fourth central through-hole and which comprises:

a third concave collector mirror, provided with a fifth central through-hole, placed coaxially with the optical axis in front of the second concave collector mirror of the main collector stage, the concavity of the third concave collector mirror being directed toward the source, a third convex mirror placed centrally, coaxially with the optical axis, approximately level with the second concave collector mirror of the first exterior additional collector stage, the convexity of the third convex mirror being directed toward the front, the third concave collector mirror being suitable for receiving the part of the flux emitted by the source which reaches the third concave collector mirror by passing between the opposite edges respectively of the fourth hole of the second convex mirror of the first exterior additional collector stage and of the third convex mirror of the second exterior additional collector stage and for reflecting this flux toward a point situated at the rear of said third convex mirror, the third convex mirror being suitable for reflecting, through the fifth central through-hole of the third concave collector mirror of said first exterior additional collector stage, the flux received from said third concave collector mirror of the second exterior additional collector stage toward said final image point in front of the source, the third concave collector mirror and the third convex mirror of the second exterior additional collector stage being coated respectively with fifth and sixth multilayer reflective depositions suitable for maximizing the transmission of EUV radiation, each of said fifth and sixth reflective depositions comprising several layers adjusted according to the angle of incidence of the EUV radiation.

5. The device for collecting EUV radiation flux as claimed in claim 1, wherein said device comprises an interior additional collector stage which is situated at the rear of the first exterior additional collector stage in which the second convex mirror is provided with a fourth central through-hole and which comprises:

a third concave collector mirror with concavity directed toward the source, placed coaxially with the optical axis at the rear of the second convex mirror of the first exterior additional collector stage and provided with a fifth central through-hole, which is suitable for receiving the flux emitted by said source and for reflecting this flux toward the rear, and a third convex mirror placed centrally, coaxially with the optical axis, at the rear of the third concave collector mirror of the interior additional collector stage and suitable for reflecting, through the fifth central through-hole of the third concave collector mirror of the interior additional collector stage, the flux received from the third concave collector mirror of the interior additional collector stage toward said final image point in front of the source, said third concave collector mirror and said third convex mirror of the interior additional collector stage being coated respectively with fifth and sixth multilayer reflective depositions suitable for maximizing the transmission of EUV radiation, each of said fifth and sixth reflective depositions comprising several layers adjusted according to the angle of incidence of the EUV radiation.

6. The device for collecting EUV radiation flux as claimed in claim 5, wherein said third concave collector mirror of the interior additional collector stage is situated at the back of the second convex mirror of the first exterior additional collector stage.

7. The device as claimed in claim 4, wherein said device comprises three collector stages, namely the main collector stage, the first exterior additional collector stage whose second convex mirror is provided with the fourth central through-hole and the second exterior additional collector stage situated in front of the first exterior additional collector stage.

8. The device as claimed in claim 5, wherein said device comprises at least three collector stages, namely the main collector stage, the first exterior additional collector stage whose second convex mirror is provided with the fourth central through-hole and the interior additional collector stage situated at the rear of the first exterior additional collector stage.

9. The device as claimed in claim 1, wherein one at least of a concave collector mirror and a convex mirror of at least one collector stage is made with an axisymmetric aspherical profile.

10. The device as claimed in claim 1, wherein one at least of the first concave collector and the first convex mirrors of at least the main collector stage is made in segmented form.

* * * * *